United States Patent
Kim

(12) 
(10) Patent No.: US 6,343,609 B1
(45) Date of Patent: Feb. 5, 2002

(54) CLEANING WITH LIQUIFIED GAS AND MEGASONICS

(75) Inventor: Ben Kim, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/133,889

(22) Filed: Aug. 13, 1998

(51) Int. Cl.[7] ............................... B08B 3/10; B08B 3/12
(52) U.S. Cl. ............................ 134/1.3; 134/1; 134/199; 134/198; 134/902; 134/34
(58) Field of Search .................. 134/1, 1.3, 2, 199, 134/902, 198, 34, 36, 37, 6, 7; 451/38, 39, 102, 99

(56) References Cited

U.S. PATENT DOCUMENTS

| | | |
|---|---|---|
| 4,326,553 A | 4/1982 | Hall |
| 5,062,898 A | 11/1991 | McDermott et al. |
| 5,213,619 A | 5/1993 | Jackson et al. |
| 5,316,591 A | 5/1994 | Chao et al. |
| 5,456,759 A | 10/1995 | Stanford, Jr. et al. |
| 5,494,526 A | 2/1996 | Paranjpe |
| 5,555,902 A * | 9/1996 | Menon ........................ 134/199 |
| 5,558,110 A * | 9/1996 | Williford, Jr. ............. 134/56 R |
| 5,651,834 A * | 7/1997 | Jon et al. ...................... 134/31 |
| 5,766,368 A * | 6/1998 | Bowers ......................... 134/6 |
| 5,789,505 A * | 8/1998 | Wilkinson et al. .......... 526/209 |
| 5,837,064 A * | 11/1998 | Bowers ......................... 134/6 |
| 5,927,305 A * | 7/1999 | Shiba ........................ 134/153 |
| 5,928,434 A * | 7/1999 | Goenka ......................... 134/2 |
| 5,964,952 A * | 10/1999 | Kunze-Concewitz ........... 134/2 |
| 5,975,098 A * | 11/1999 | Yoshitani et al. ............ 134/148 |

\* cited by examiner

*Primary Examiner*—Alexander Markoff
(74) *Attorney, Agent, or Firm*—DeLio & Peterson, LLC; John J. Tomaszewski; William D. Sabo

(57) ABSTRACT

An apparatus and method are provided for cleaning (removing) contaminating particles and/or films from substrate surfaces such as semiconductor wafers during the fabrication process for making electronic components. The method and apparatus use a liquified gas contained in a distributor which has been energized with megasonic energy in the distributor and the energized liquefied gas directed as a stream against the surface to be cleaned from an outlet distribution nozzle of the distributor. The stream is preferably impinged on the substrate surface at an acute angle. The preferred liquified gas is carbon dioxide.

22 Claims, 1 Drawing Sheet

CLEANING WITH LIQUIFIED GAS AND MEGASONICS

BACKGROUND OF THE INVENTION

1. Field of the Invention

This invention relates generally to the fabrication of electronic components such as integrated circuit semiconductors and, in particular, to the cleaning of contaminates from the surface of substrates such as semiconductor wafers used to make the electronic component.

2. Description of Related Art

The fabrication of electronic components such as integrated circuit semiconductors is very exacting and complex and requires a number of processing steps requiring extreme precision to form the desired circuit pattern on the component substrate. Typical semiconductor devices now have circuit line widths typically less than 1 micron with close spacing of the lines and via interconnections. Contamination of the semiconductor substrate in the form of particles and/or films on the substrate may cause short circuits, open circuits and other defects which can cause the component to fail and/or adversely affect the performance of the component. For example, an individual particle as small as 100 angstroms in diameter can result in a killer defect in a modern microcircuit electronic component.

Cleaning the surface of the semiconductor substrate is therefore a critical step in integrated circuit fabrication and periodic cleaning of the substrate during the fabrication process is needed to maintain product integrity. There are currently numerous methods used to clean substrate surfaces in the electronic industry and basically solvents or chemical cleaning are used to remove contaminate particles and films from the surfaces. Chemical solutions are typically combined with megasonic or ultrasonic devices wherein the component to be cleaned is immersed in the chemical solution and the megasonic or ultrasonic devices used to impart high energy sonic waves to the surface of the component which in combination with the chemical solution removes organic films, ionic impurities and contaminate particles from the substrate surface.

A number of cleaning methods are described in U.S. Pat. No. 5,062,898, which patent is hereby incorporated by reference. For example, gas jet cleaning and liquid spray cleaning are used to clean relatively large particles from silicon wafers. Another cleaning technique involves the use of a carbon dioxide aerosol to "sand blast" a contaminated surface. In this process, pressurized gaseous carbon dioxide is expanded in an outlet nozzle, and the resulting cooling forms solid carbon dioxide particles in the outlet stream which traverses the surface boundary layer of the substrate and strikes the contaminated surface. The technique of utilizing solid carbon dioxide to remove particulates from surfaces is noted therein. A number of other cleaning techniques using carbon dioxide are discussed in the patent.

A process for removing undesired sub-micron particles from a substrate is shown in U.S. Pat. No. 5,456,759 wherein the substrate to be cleaned is placed in a cleaning chamber provided with megasonic energy-producing means. A liquefied gas such as liquid carbon dioxide is introduced into the cleaning chamber and the substrate subjected to the liquid carbon dioxide agitated using megasonic energy. Another method for cleaning semiconductor wafers using liquefied gases is shown in U.S. Pat. No. 5,494,526 wherein a semiconductor is placed in a cleaning chamber and the liquefied gas cleaning agent changed to a vapor phase so that the cleaning agent penetrates the topography of the surface to be cleaned. The cleaning agent is then returned to the liquid phase in the cleaning chamber and finally flash-evaporated to complete the cleaning process. Megasonic units or exciters are provided to megasonically agitate the bath and the wafer semiconductor substrate in contact with the cleaning agent.

Another method for removing undesired materials from a substrate is shown in U.S. Pat. No. 5,316,591 wherein the contaminated substrate is placed in a cleaning chamber provided with cavitation-producing means. A liquefied gas such as liquid carbon dioxide is introduced into the cleaning chamber and the liquid carbon dioxide cavitated using a megasonic transducer.

All the above patents are hereby incorporated by reference.

Unfortunately, wafer contamination is still a problem in the semiconductor fabrication industry and as the industry advances and technology is being developed to form smaller and more complex circuits, a more effective and efficient cleaning method is required to produce semiconductor components.

Bearing in mind the problems and deficiencies of the prior art, it is therefore an object of the present invention to provide a method for removing contaminating particles and/or films from a surface such as a substrate used to make electronic components such as semiconductors which method is efficient and effective to remove contaminating particles less than 0.1 micron from the substrate surface.

It is a further object of the present invention to provide an apparatus for removing contaminating particles and/or films from substrates used to make electronic components such as semiconductor wafers which apparatus is efficient and effective to remove contaminating particles less than 0.1 micron from the substrate surface.

It is another object of the present invention to provide electronic component substrates including semiconductor wafers which have been cleaned using the method and apparatus of the invention.

Another object of the invention is to provide electronic components made using electronic component substrates cleaned using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for removing contaminating particles and/or films from a contaminating particle and/or film containing surface such as a semiconductor wafer comprising the steps of:

providing a liquefied gas in a distributor having an outlet nozzle;

imparting megasonic energy to the liquefied gas in the distributor thereby energizing the liquefied gas; and directing the energized liquefied gas from the outlet nozzle of the distributor as a liquid stream onto the surface of the substrate having contaminating particles and/or films to remove the contaminating particles and/or films from the substrate surface to provide a cleaned substrate surface.

In another aspect of the present invention, an apparatus is provided for removing contaminating particles and/or films from a contaminating particle and/or film containing substrate surface such as a semiconductor wafer comprising:

distributor means for holding a supply of liquefied gas the distributor means having an outlet distribution nozzle;

megasonic energy forming means associated with the distributor means to energize the liquefied gas held in the distributor means;

wherein the energized liquefied gas is directed as a liquid from the outlet distribution nozzle to a substrate surface having contaminating particles and/or a film thereon so that the contaminating particles and/or film are removed from the substrate surface providing a cleaned substrate surface.

In another aspect of the present invention, the megasonically energized liquefied gas stream is directed onto the surface to be cleaned at an acute angle formed by the plane of the surface to be cleaned and the direction of the megasonically accuated liquefied gas being directed from the outlet distribution nozzle and impinging on the substrate surface. An acute angle between 30° and 60° is preferred.

In another aspect of the present invention, the method and apparatus of the invention may be employed to clean a variety of surfaces having contaminating particles and/or films such as circuit boards, medical instruments and optical lenses as well as semiconductor wafers and other substrates used in electronic component fabrication.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
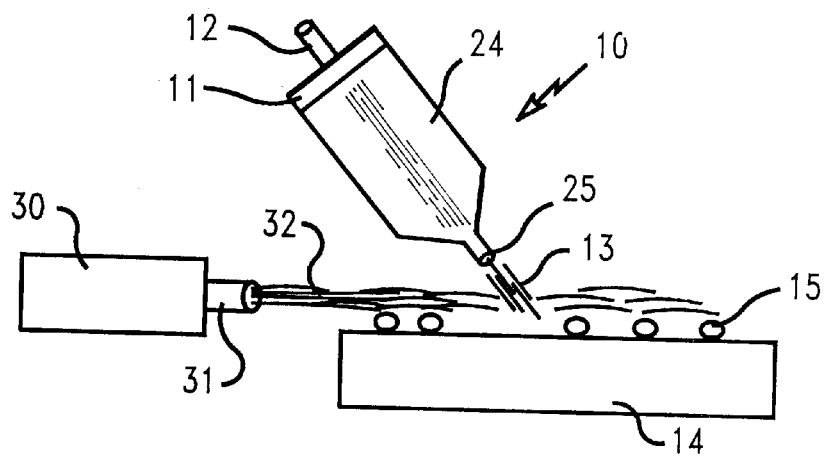
FIG. 1 is a schematic of a cleaning system showing a megasonically energized liquefied gas cleaning stream directed from an outlet distribution nozzle at the surface of a wafer substrate.

In describing the preferred embodiment of the present invention, reference will be made herein to FIGS. 1–4 of the drawings in which like numerals refer to like features of the invention. Features of the invention are not necessarily shown to scale in the drawings.

The present invention is applicable to cleaning processes for cleaning a wide variety of substrates such as circuit boards, medical instruments and optical lenses and in particular electronic component substrates such as semiconductor wafers used in the fabrication of integrated circuits. Contaminant materials which may be removed from substrates in accordance with the present invention include, but are not limited to, oil, grease, lubricants, solder flux residues, photoresist, particulates comprising inorganic or organic materials, adhesive residues, plasticizers, unreacted monomers, dyes, and dielectric fluids. Typical substrates from which contaminants may be removed by the present process include, but are not limited to, substrates formed of metal, rubber, plastic, cotton, cellulose, ceramics, and other organic or inorganic compounds. The following description will be directed for convenience to semiconductor wafers used in electronic component fabrication, although it will be appreciated by those skilled in the art that other substrates may suitably be cleaned using the methods and apparatus of the invention.

The present invention may be broadly stated as comprising a method and apparatus for cleaning semiconductor wafer substrates comprising directing a liquefied gas stream contained in a distributor, which liquefied gas has been energized with megasonic energy, at the surface of the substrate to be cleaned. The energized liquefied gas stream is directed to the substrate surface from a distribution nozzle of the distributor and the stream preferably contains the liquefied gas in a predominately liquefied form. The combination of a liquefied gas contained in a distributor and which has been energized with megasonic energy and directing the energized liquefied gas at a substrate containing contaminates and/or film contaminates provides effective and efficient cleaning of the substrate surface.

The megasonic energy employed in the present invention may be produced by known means such as a high frequency transducer that produces energy having a frequency typically at about 110 to 2000 Kilohertz. The frequency is preferably about 800 to 1000 Kilohertz. Such megasonic energy producing transducers are commercially available. The frequency may be adjusted depending on the contaminant to be removed and/or the cleaning desired.

A wide variety of gases may be used in practicing the present invention with the preferable condition that the gas be easily liquifiable at non-extreme temperatures and pressures. Gases which may be used include carbon dioxide, nitrogen, nitrous oxide, sulfur hexafluoride, xenon. Carbon dioxide is the most preferred because of its availability and low cost.

Carbon dioxide is a readily available, inexpensive, non-toxic and an easily liquefiable material. Once liquefied, it offers a good, low viscosity sonicating medium at relatively low pressures and mild temperatures. The critical pressure of $CO_2$ is about 75 $Kg/cm^2$ and the critical temperature is 32° C. Accordingly, low pressures of (about 42 to 73 $Kg/cm^2$) and mild temperatures about 10° to 32° C. may suitably be employed. Lower temperatures and pressures may be employed as long as the gas is liquefied in the distributor.

The gas may also be used in mixture with other gases as long as an easily liquifiable gas is obtained. The liquefied gas may also be used with modifiers to improve the solubility properties and cleaning properties of the liquefied gas stream. Small amounts greater than about 0.1% by weight of organic solvents, for example, may be employed in the liquefied gas mixture for solvent cleaning properties. Such modifiers may include isopropanol, acetone, hexane, kerosene and the like.

Referring now to FIG. 1, a substrate is shown being cleaned using a method and apparatus of the invention. The apparatus is shown generally as 10 and comprises a distributor 24. The distributor 24 is generally cylindrical having an inlet 12 and nozzle outlet 25. The inlet 12 is typically used to provide a supply of liquefied gas to the distributor. It will be appreciated by those skilled in the art that the distributor 10 may contain a sufficient amount of liquefied gas therein so that additional liquefied gas added through inlet means 12 is not required during the cleaning operation. It is generally preferred, however, that a source of liquefied gas be introduced into distributor 24 through inlet means 12 during the cleaning process to maintain the distributor 24 in a full condition.

The distributor 24 has an outlet nozzle distribution 25 which is shown producing a circular jet type stream 13 of liquefied gas which is energized with megasonic energy. The distributor 24 has incorporated as part of the distributor a transducer 11 communicates with the upper part of the distributor and provides the megasonic energy to energize the liquefied gas in the distibutor.

During the cleaning operation, liquefied gas in the distributor 24 is energized with megasonic energy from transducer 11 and the outlet nozzle 25 is controlled to provide a stream therefrom of energized liquefied gas 13. As can be seen from FIG. 1, the energized liquefied gas stream 13 is directed at an acute angle at the surface of substrate 14. Substrate 14 may be any substrate such as a semiconductor wafer. Contaminating particles 15 are shown on the surface of substrate 14 and it is these particles which are removed by the energized liquefied gas stream 13.

In a highly preferred embodiment, an inert sweeping gas is employed during the process to carry away the liquefied gas and contaminating particles and/or films. An inert gas supply shown as 30 having an outlet nozzle 31 provides a gas stream 32 which flows across the surface of the substrate 14. The inert gas is typically argon, helium, nitrogen or the like and the flow across the surface is preferably laminar.

It is an important feature of the present invention that the megasonically energized liquefied gas stream 13 impinge upon the surface of substrate 14 and be immediately deflected away from the surface of substrate 14 by the force of the stream and carrying contaminating particles therewith. Accordingly, there is no prolonged contact of the surface of substrate 14 as in conventional cleaning devices where the substrate is immersed in a cleaning solution and subjected to megasonic energy. In this type apparatus and method the cleaning liquefied gas may redeposit any contaminating particles removed from the substrate surface by the cleaning liquefied gas. In the present invention, the megasonically energized liquid gas stream is deflected immediately from the surface of substrate 14 carrying with it contaminating particles. Any contact of the stream 13 with the surface of substrate 14 is momentary based on any frictional drag effect of the stream along the substrate surface but this contact is only momentary and the stream is vaporized almost immediately upon contact carrying with it contaminating particles from the substrate surface. The sweeping gas in combination with the liquefied gas provides an enhanced cleaning effect.

The process may be performed at any pressure but is preferred that the cleaning be performed at atmospheric pressure so that the liquefied gas stream vaporizes after momentary contact with the substrate. The contacting may be done at an elevated pressure or under vacuum as long as the energized liquefied gas stream contacts the surface of substrate 14 predominantly as a liquefied gas.

Figure 2:
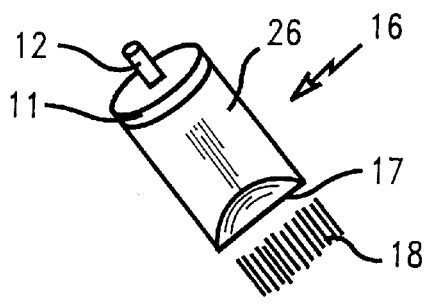
FIG. 2 is perspective view of a distributor of the invention showing a uniform liquefied gas cleaning stream across the width of the outlet of a distribution nozzle.
Figure 3:
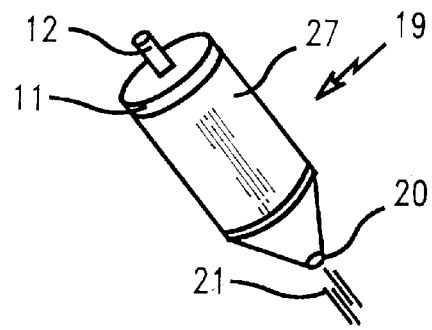
FIG. 3 is a perspective view of a distributor of the invention having a circular nozzle outlet opening to provide a concentrated circular liquefied gas cleaning stream from the nozzle.
Figure 4:
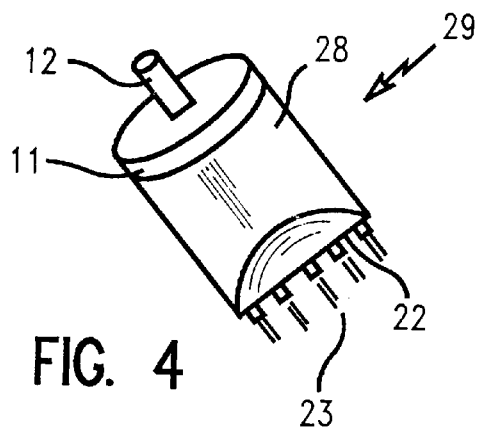
FIG. 4 is a perspective view of a distributor of the invention having a plurality of output ports spaced evenly across the width of an outlet distribution nozzle for providing a plurality of uniform cleaning streams from the nozzle.

Referring now to FIGS. 2, 3 and 4, various distributors which may be used in the invention are shown. In FIG. 2, the distributor shown generally as 16 comprises a cylindrical distributor 26 having an inlet 12 and a slit outlet distribution nozzle 17 running the width (diameter) of the distributor. A transducer 11 is positioned at the upper end of distributor 26.

Because of the slit 17, an energized liquefied gas stream is produced in the form of a slit across the width of the distributor. The thickness of the stream can be controlled by controlling the thickness of the slit.

Referring to FIG. 3, a distributor shown generally as 19 comprises a cylindrical distributor 27 having an inlet 12 and a circular outlet distribution nozzle 20 which is smaller in diameter than the diameter of the distributor. A transducer 11 is positioned at the upper end of distributor 27. The energized liquefied gas stream 21 is formed as circular in cross-section.

Referring now to FIG. 4, a distributor shown generally as 29 comprises a circular distributor housing 28 having an inlet 12 and a plurality of circular openings 22 positioned across the width (diameter) of distributor housing 28. Transducer 11 is shown positioned at the upper portion of distributor 28. An energized liquefied gas stream 23 is shown as a plurality of circular cross-sectional streams exiting from the corresponding circular openings 22 of the distributor housing 28.

Each of the above distributors may be used for varying applications depending on the cleaning desired. For the cleaning of a substrate in which a concentrated stream flow is desired at a particular point on the substrate, the circular nozzle of FIG. 3 would be preferably used. The distribution nozzle of FIG. 2 would be preferably used for general cleaning of a substrate where an energized liquefied gas stream is applied uniformly over the substrate surface. The nozzle of FIG. 4 can be used for a number of uses requiring a plurality of concentrated liquefied gas streams.

Referring back to FIG. 1, the substrate 14 to be cleaned may be stationary on a surface or may be rotated about a vertical axis such as in a chemical/mechanical planarization process. The cleaning operation is typically performed one or more times during the sequence of fabrication steps. The wafer may be positioned on a platen which is moveable along horizontal and/or vertical axes, rotatable or stationary, and the cleaning apparatus of the invention introduced into the wafer area for cleaning when desired.

In operation, it is preferred that the end of the outlet distribution nozzle be positioned at a vertical distance of approximately $\frac{1}{16}$ inch to several inches above the contaminated surface. The angle of impingement is preferably an acute angle and preferably about 30° to 60°.

Contaminants may be removed from the vaporized liquefied gas and the gas reliquefied and recycled to the distributor.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for removing contaminating particles from a contaminating particle containing substrate surface comprising the steps of:

providing a liquefied gas in a distributor having an outlet nozzle;

imparting megasonic energy to the liquefied gas in the distributor thereby energizing the liquefied gas;

directing the energized liquefied gas from the outlet nozzle of the distributor as a liquid stream onto the surface of the substrate having contaminated particles; and impinging the surface of the substrate with the liquid stream to remove the contaminating particles from the substrate surface when the energized liquefied gas vaporizes upon contact with the substrate surface carrying with it contaminating particles from the substrate surface to provide a cleaned substrate surface.

2. The method of claim 1 wherein the liquefied gas is selected from the group consisting of carbon dioxide, nitrogen, nitrous oxide, sulfur hexafluoride and xenon.

3. The method of claim 2 wherein the liquefied gas is carbon dioxide.

4. The method of claim 1 wherein the megasonic energy has a frequency of about 110 to 2000 kilohertz.

5. The method of claim 1 wherein the liquefied gas is used in mixture with an organic solvent modifier.

6. The method of claim 1 wherein the outlet nozzle of the distributor is in the form of a slit running a width of the distributor.

7. The method of claim 1 wherein the outlet nozzle is cylindrical.

8. The method of claim 1 wherein the outlet nozzle comprises a plurality of circular openings positioned across a width of the distributor.

9. The method of claim 1 wherein an inert sweeping gas flows across the surface of the substrate being cleaned and carries away the liquefied gas and contaminating particles film.

10. The method of claim 1 wherein the liquefied gas containing the contaminating particles is treated by removing the contaminating particles from the liquefied gas, re-liquefying the gas, and recycling to the distributor.

11. The method of claim 1 which is performed at atmospheric pressure.

12. The method of claim 1 wherein the contaminating particles film containing substrate is a semiconductor wafer.

13. An apparatus for removing contaminating particles from a contaminating particle containing substrate surface comprising: distributor means for holding a supply of liquefied gas, the distributor means having an outlet distribution nozzle for directing the liquefied gas to a substrate surface;

megasonic energy forming means in communication with the distributor means to energize the liquefied gas held in the distributor means; and means for directing the energized liquefied gas as a liquid stream from the outlet distribution nozzle to impinge a substrate surface having contaminating particles thereon with the liquid stream so that the contaminating particles are removed from the substrate surface when the energized liquefied gas vaporizes upon contact with the substrate surface carrying with it contaminating particles from the substrate surface to [providing] provide a cleaned substrate surface.

14. The apparatus of claim 13 wherein the liquefied gas is selected from the group consisting of carbon dioxide, nitrogen, nitrous oxide, sulfur hexafluoride and xenon.

15. The apparatus of claim 14 wherein the liquefied gas is carbon dioxide.

16. The apparatus of claim 13 wherein the distributor means holds the liquefied gas and an organic solvent modifier.

17. The apparatus of claim 13 wherein the outlet distribution nozzle of the distributor is in the form of a slit running a width of the distributor.

18. The apparatus of claim 13 wherein the outlet distribution nozzle is cylindrical.

19. The apparatus of claim 13 wherein the outlet distribution nozzle comprises a plurality of circular openings positioned across a width of the distributor.

20. The apparatus of claim 13 wherein an inert sweeping gas means are provided wherein the inert sweeping gas flows across the surface of the substrate being cleaned and carries away the liquefied gas and contaminating particles films.

21. The apparatus of claim 13 wherein recycle means are provided wherein the liquefied gas containing the contaminating particles is treated by removing the contaminating particles, re-liquefying the gas and recycling to the distributor.

22. The apparatus of claim 13 wherein the substrate surface is a semiconductor wafer.

* * * * *